(12) United States Patent
Dunklee

(10) Patent No.: US 7,468,609 B2
(45) Date of Patent: *Dec. 23, 2008

(54) SWITCHED SUSPENDED CONDUCTOR AND CONNECTION

(75) Inventor: John Dunklee, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/786,484

(22) Filed: Apr. 11, 2007

(65) Prior Publication Data

US 2007/0205784 A1    Sep. 6, 2007

Related U.S. Application Data

(63) Continuation of application No. 10/794,511, filed on Mar. 5, 2004, now Pat. No. 7,221,172.

(60) Provisional application No. 60/468,851, filed on May 6, 2003.

(51) Int. Cl.
G01R 31/02    (2006.01)
G01R 31/26    (2006.01)
(52) U.S. Cl. .................. 324/754; 324/755; 324/158.1
(58) Field of Classification Search ......... 324/754–765, 324/158.1
See application file for complete search history.

(56) References Cited

U.S. PATENT DOCUMENTS

| | | | |
|---|---|---|---|
| 1,337,866 A | 4/1920 | Whitaker | |
| 2,142,625 A | 1/1939 | Zoethoul | |
| 2,197,081 A | 4/1940 | Piron | |
| 2,376,101 A | 5/1945 | Tyzzer | |
| 2,389,668 A | 11/1945 | Johnson | |
| 2,471,897 A | 5/1949 | Rappi | |
| 2,812,502 A | 11/1957 | Doherty | |
| 3,176,091 A | 3/1965 | Hanson et al. | |
| 3,185,927 A | 5/1965 | Margulis et al. | |
| 3,192,844 A | 7/1965 | Szasz et al. | |
| 3,193,712 A | 7/1965 | Harris | |
| 3,201,721 A | 8/1965 | Voelcker | |
| 3,230,299 A | 1/1966 | Radziejowski | |
| 3,256,484 A | 6/1966 | Terry | |
| 3,265,969 A | 8/1966 | Catu | |

(Continued)

FOREIGN PATENT DOCUMENTS

CN    1083975    3/1994

(Continued)

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

(Continued)

Primary Examiner—Ha Tran T Nguyen
Assistant Examiner—Emily Y Chan
(74) Attorney, Agent, or Firm—Chernoff, Vilhauer, McClung & Stenzel

(57) ABSTRACT

A probe assembly having a switch that selectively electrically connects, for example, either a Kelvin connection or a suspended guard element with the probe assembly.

18 Claims, 5 Drawing Sheets

U.S. PATENT DOCUMENTS

| | | |
|---|---|---|
| 3,289,046 A | 11/1966 | Carr |
| 3,333,274 A | 7/1967 | Forcier |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,648,169 A | 3/1972 | Wiesler |
| 3,654,573 A | 4/1972 | Graham |
| 3,662,318 A | 5/1972 | Decuyper |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,327,180 A | 4/1982 | Chen |
| 4,330,783 A | 5/1982 | Toia |
| 4,342,958 A * | 8/1982 | Russell ..................... 324/754 |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |
| 4,780,670 A | 10/1988 | Cherry |
| 4,783,625 A | 11/1988 | Harry et al. |
| 4,784,213 A | 11/1988 | Eager et al. |
| 4,786,867 A | 11/1988 | Yamatsu |
| 4,791,752 A | 11/1988 | Fraser et al. |
| 4,791,363 A | 12/1988 | Logan |

| | | | | | |
|---|---|---|---|---|---|
| 4,795,962 A | 1/1989 | Yanagawa et al. | 5,105,148 A | 4/1992 | Lee |
| 4,805,627 A | 2/1989 | Klingenbeck et al. | 5,105,181 A | 4/1992 | Ross |
| 4,810,981 A | 3/1989 | Herstein | 5,107,076 A | 4/1992 | Bullock et al. |
| 4,812,754 A | 3/1989 | Tracy et al. | 5,136,237 A | 8/1992 | Smith et al. |
| 4,816,767 A | 3/1989 | Cannon et al. | 5,142,224 A | 8/1992 | Smith et al. |
| 4,818,169 A | 4/1989 | Schram et al. | 5,144,228 A | 9/1992 | Sorna et al. |
| 4,827,211 A | 5/1989 | Strid et al. | 5,159,264 A | 10/1992 | Anderson |
| 4,831,494 A | 5/1989 | Arnold et al. | 5,159,267 A | 10/1992 | Anderson |
| 4,838,802 A | 6/1989 | Soar | 5,159,752 A | 11/1992 | Mahant-Shetti et al. |
| 4,839,587 A | 6/1989 | Flatley et al. | 5,160,883 A | 11/1992 | Blanz |
| 4,845,426 A | 7/1989 | Nolan et al. | 5,164,319 A | 11/1992 | Hafeman et al. |
| 4,849,689 A | 7/1989 | Gleason | 5,164,661 A | 11/1992 | Jones |
| 4,853,613 A | 8/1989 | Sequeira et al. | 5,166,606 A | 11/1992 | Blanz |
| 4,853,624 A | 8/1989 | Rabjohn | 5,172,049 A | 12/1992 | Kiyokawa et al. |
| 4,853,627 A | 8/1989 | Gleason et al. | 5,172,051 A | 12/1992 | Zamborelli |
| 4,856,426 A | 8/1989 | Wirz | 5,187,443 A | 2/1993 | Bereskin |
| 4,856,904 A | 8/1989 | Akagawa | 5,198,752 A | 3/1993 | Miyata et al. |
| 4,858,160 A | 8/1989 | Strid et al. | 5,198,753 A | 3/1993 | Hamburgen |
| 4,859,989 A | 8/1989 | McPherson | 5,198,756 A | 3/1993 | Jenkins et al. |
| 4,864,227 A | 9/1989 | Sato | 5,198,758 A | 3/1993 | Iknaian et al. |
| 4,871,883 A | 10/1989 | Guiol | 5,202,558 A | 4/1993 | Barker |
| 4,871,965 A | 10/1989 | Elbert et al. | 5,209,088 A | 5/1993 | Vaks |
| 4,884,026 A | 11/1989 | Hayakawa et al. | 5,210,377 A | 5/1993 | Kennedy et al. |
| 4,884,206 A | 11/1989 | Mate | 5,210,485 A | 5/1993 | Kreiger et al. |
| 4,888,550 A | 12/1989 | Reid | 5,214,243 A | 5/1993 | Johnson |
| 4,891,584 A | 1/1990 | Kamieniecki et al. | 5,214,374 A | 5/1993 | St. Onge |
| 4,893,914 A | 1/1990 | Hancock et al. | 5,218,185 A | 6/1993 | Gross |
| 4,894,612 A | 1/1990 | Drake et al. | 5,220,277 A | 6/1993 | Reitinger |
| 4,896,109 A | 1/1990 | Rauscher | 5,221,905 A | 6/1993 | Bhangu et al. |
| 4,899,998 A | 2/1990 | Teramachi | 5,225,037 A | 7/1993 | Elder et al. |
| 4,904,933 A | 2/1990 | Snyder et al. | 5,225,796 A | 7/1993 | Williams et al. |
| 4,904,935 A | 2/1990 | Calma et al. | 5,227,730 A | 7/1993 | King et al. |
| 4,906,920 A | 3/1990 | Huff et al. | 5,232,789 A | 8/1993 | Platz et al. |
| 4,916,398 A | 4/1990 | Rath | 5,233,197 A | 8/1993 | Bowman et al. |
| 4,918,279 A | 4/1990 | Babel et al. | 5,233,306 A | 8/1993 | Misra |
| 4,918,374 A | 4/1990 | Stewart et al. | 5,237,267 A | 8/1993 | Harwood et al. |
| 4,918,383 A | 4/1990 | Huff et al. | 5,245,292 A | 9/1993 | Milesky et al. |
| 4,922,128 A | 5/1990 | Dhong et al. | 5,266,889 A | 11/1993 | Harwood et al. |
| 4,922,186 A | 5/1990 | Tsuchiya et al. | 5,267,088 A | 11/1993 | Nomura |
| 4,923,407 A | 5/1990 | Rice et al. | 5,270,664 A | 12/1993 | McMurtry et al. |
| 4,926,118 A | 5/1990 | O'Connor et al. | 5,274,336 A | 12/1993 | Crook et al. |
| 4,929,893 A | 5/1990 | Sato et al. | 5,278,494 A | 1/1994 | Obigane |
| 4,933,634 A | 6/1990 | Cuzin et al. | 5,280,156 A | 1/1994 | Niori et al. |
| 4,968,931 A | 11/1990 | Littlebury et al. | 5,298,972 A | 3/1994 | Heffner |
| 4,978,907 A | 12/1990 | Smith | 5,303,938 A | 4/1994 | Miller et al. |
| 4,978,914 A | 12/1990 | Akimoto et al. | 5,304,924 A | 4/1994 | Yamano et al. |
| 4,982,153 A | 1/1991 | Collins et al. | 5,315,237 A | 5/1994 | Iwakura et al. |
| 4,994,737 A | 2/1991 | Carlton et al. | 5,321,352 A | 6/1994 | Takebuchi |
| 5,001,423 A | 3/1991 | Abrami et al. | 5,321,453 A | 6/1994 | Mori et al. |
| 5,006,796 A | 4/1991 | Burton et al. | 5,325,052 A | 6/1994 | Yamashita |
| 5,010,296 A | 4/1991 | Okada et al. | 5,334,931 A | 8/1994 | Clarke et al. |
| 5,019,692 A | 5/1991 | Nbedi et al. | 5,336,989 A | 8/1994 | Hofer |
| 5,030,907 A | 7/1991 | Yih et al. | 5,345,170 A | 9/1994 | Schwindt et al. |
| 5,034,688 A | 7/1991 | Moulene et al. | 5,357,211 A | 10/1994 | Bryson et al. |
| 5,041,782 A | 8/1991 | Marzan | 5,363,050 A | 11/1994 | Guo et al. |
| 5,045,781 A | 9/1991 | Gleason et al. | 5,369,368 A | 11/1994 | Kassen et al. |
| 5,061,823 A | 10/1991 | Carroll | 5,369,370 A | 11/1994 | Stratmann et al. |
| 5,065,089 A | 11/1991 | Rich | 5,371,457 A | 12/1994 | Lipp |
| 5,065,092 A | 11/1991 | Sigler | 5,373,231 A | 12/1994 | Boll et al. |
| 5,066,357 A | 11/1991 | Smyth, Jr. et al. | 5,374,938 A | 12/1994 | Hatazawa et al. |
| 5,070,297 A | 12/1991 | Kwon et al. | 5,376,790 A | 12/1994 | Linker et al. |
| 5,077,523 A | 12/1991 | Blanz | 5,382,898 A | 1/1995 | Subramanian |
| 5,082,627 A | 1/1992 | Stanbro | 5,397,855 A | 3/1995 | Ferlier |
| 5,084,671 A | 1/1992 | Miyata et al. | 5,404,111 A | 4/1995 | Mori et al. |
| 5,089,774 A | 2/1992 | Nakano | 5,408,188 A | 4/1995 | Katoh |
| 5,091,691 A | 2/1992 | Kamieniecki et al. | 5,408,189 A | 4/1995 | Swart et al. |
| 5,091,692 A | 2/1992 | Ohno et al. | 5,410,259 A | 4/1995 | Fujihara et al. |
| 5,091,732 A | 2/1992 | Mileski et al. | 5,412,330 A | 5/1995 | Ravel et al. |
| 5,095,891 A | 3/1992 | Reitter | 5,412,866 A | 5/1995 | Woith et al. |
| 5,097,207 A | 3/1992 | Blanz | 5,414,565 A | 5/1995 | Sullivan et al. |
| 5,101,149 A | 3/1992 | Adams et al. | 5,422,574 A | 6/1995 | Kister |
| 5,101,453 A | 3/1992 | Rumbaugh | 5,434,512 A | 7/1995 | Schwindt et al. |
| 5,103,169 A | 4/1992 | Heaton et al. | 5,448,172 A | 9/1995 | Dechene et al. |

| | | | | | |
|---|---|---|---|---|---|
| 5,451,884 A | 9/1995 | Sauerland | 5,670,322 A | 9/1997 | Eggers et al. |
| 5,457,398 A | 10/1995 | Schwindt et al. | 5,670,888 A | 9/1997 | Cheng |
| 5,461,328 A | 10/1995 | Devereaux et al. | 5,672,816 A | 9/1997 | Park et al. |
| 5,467,024 A | 11/1995 | Swapp | 5,675,499 A | 10/1997 | Lee et al. |
| 5,469,324 A | 11/1995 | Henderson et al. | 5,675,932 A | 10/1997 | Mauney |
| 5,475,316 A | 12/1995 | Hurley et al. | 5,676,360 A | 10/1997 | Boucher et al. |
| 5,477,011 A | 12/1995 | Singles et al. | 5,680,039 A | 10/1997 | Mochizuki et al. |
| 5,478,748 A | 12/1995 | Akins, Jr. et al. | 5,682,337 A | 10/1997 | El-Fishaway et al. |
| 5,479,108 A | 12/1995 | Cheng | 5,685,232 A | 11/1997 | Inoue |
| 5,479,109 A | 12/1995 | Lau et al. | 5,704,355 A | 1/1998 | Bridges |
| 5,481,196 A | 1/1996 | Nosov | 5,712,571 A | 1/1998 | O'Donoghue |
| 5,481,936 A | 1/1996 | Yanagisawa | 5,715,819 A | 2/1998 | Svenson et al. |
| 5,486,975 A | 1/1996 | Shamouilian et al. | 5,729,150 A | 3/1998 | Schwindt |
| 5,488,954 A | 2/1996 | Sleva et al. | 5,731,708 A | 3/1998 | Sobhami |
| 5,491,426 A | 2/1996 | Small | 5,731,920 A | 3/1998 | Katsuragawa |
| 5,493,070 A | 2/1996 | Habu | 5,744,971 A | 4/1998 | Chan et al. |
| 5,493,236 A | 2/1996 | Ishii et al. | 5,748,506 A | 5/1998 | Bockelman |
| 5,500,606 A | 3/1996 | Holmes | 5,751,252 A | 5/1998 | Phillips |
| 5,505,150 A | 4/1996 | James et al. | 5,767,690 A | 6/1998 | Fujimoto |
| 5,506,498 A | 4/1996 | Anderson et al. | 5,773,951 A | 6/1998 | Markowski et al. |
| 5,506,515 A | 4/1996 | Godshalk et al. | 5,777,485 A | 7/1998 | Tanaka et al. |
| 5,508,631 A | 4/1996 | Manku et al. | 5,792,668 A | 8/1998 | Fuller et al. |
| 5,510,792 A | 4/1996 | Ono et al. | 5,793,213 A | 8/1998 | Bockelman et al. |
| 5,511,010 A | 4/1996 | Burns | 5,794,133 A | 8/1998 | Kashima |
| 5,512,835 A | 4/1996 | Rivera et al. | 5,798,652 A | 8/1998 | Taraci |
| 5,515,167 A | 5/1996 | Ledger et al. | 5,802,856 A | 9/1998 | Schaper et al. |
| 5,517,111 A | 5/1996 | Shelor | 5,804,982 A | 9/1998 | Lo et al. |
| 5,521,522 A | 5/1996 | Abe et al. | 5,804,983 A | 9/1998 | Nakajima et al. |
| 5,523,694 A | 6/1996 | Cole, Jr. | 5,807,107 A | 9/1998 | Bright et al. |
| 5,528,158 A | 6/1996 | Sinsheimer et al. | 5,811,751 A | 9/1998 | Leong et al. |
| 5,530,371 A | 6/1996 | Perry et al. | 5,824,494 A | 10/1998 | Feldberg |
| 5,530,372 A | 6/1996 | Lee et al. | 5,828,225 A | 10/1998 | Obikane et al. |
| 5,532,609 A | 7/1996 | Harwood et al. | 5,829,437 A | 11/1998 | Bridges |
| 5,539,323 A | 7/1996 | Davis, Jr. | 5,831,442 A | 11/1998 | Heigl |
| 5,539,676 A | 7/1996 | Yamaguchi | 5,833,601 A | 11/1998 | Swartz et al. |
| 5,546,012 A | 8/1996 | Perry et al. | 5,835,997 A | 11/1998 | Yassine |
| 5,550,480 A * | 8/1996 | Nelson et al. ............... 324/754 | 5,838,161 A | 11/1998 | Akram et al. |
| 5,550,482 A | 8/1996 | Sano | 5,841,288 A | 11/1998 | Meaney et al. |
| 5,552,716 A | 9/1996 | Takahashi et al. | 5,846,708 A | 12/1998 | Hollis et al. |
| 5,554,236 A | 9/1996 | Singles et al. | 5,847,569 A | 12/1998 | Ho et al. |
| 5,561,377 A | 10/1996 | Strid et al. | 5,848,500 A | 12/1998 | Kirk |
| 5,561,585 A | 10/1996 | Barnes et al. | 5,852,232 A | 12/1998 | Samsavar et al. |
| 5,565,788 A | 10/1996 | Burr et al. | 5,854,608 A | 12/1998 | Leisten |
| 5,565,881 A | 10/1996 | Phillips et al. | 5,857,667 A | 1/1999 | Lee |
| 5,569,591 A | 10/1996 | Kell et al. | 5,861,743 A | 1/1999 | Pye et al. |
| 5,571,324 A | 11/1996 | Sago et al. | 5,867,073 A | 2/1999 | Weinreb et al. |
| 5,572,398 A | 11/1996 | Federlin et al. | 5,869,326 A | 2/1999 | Hofmann |
| 5,578,932 A | 11/1996 | Adamian | 5,869,975 A | 2/1999 | Strid et al. |
| 5,583,445 A | 12/1996 | Mullen | 5,874,361 A | 2/1999 | Collins et al. |
| 5,584,608 A | 12/1996 | Gillespie | 5,879,289 A | 3/1999 | Yarush et al. |
| 5,594,358 A | 1/1997 | Ishikawa et al. | 5,883,522 A | 3/1999 | O'Boyle |
| 5,600,256 A | 2/1997 | Woith et al. | 5,883,523 A | 3/1999 | Ferland et al. |
| 5,604,444 A | 2/1997 | Harwood et al. | 5,888,075 A | 3/1999 | Hasegawa et al. |
| 5,610,529 A | 3/1997 | Schwindt | 5,892,539 A | 4/1999 | Colvin |
| 5,611,946 A | 3/1997 | Leong et al. | 5,900,737 A | 5/1999 | Graham et al. |
| 5,617,035 A | 4/1997 | Swapp | 5,903,143 A | 5/1999 | Mochizuki et al. |
| 5,628,057 A | 5/1997 | Phillips et al. | 5,905,421 A | 5/1999 | Oldfield |
| 5,629,631 A | 5/1997 | Perry et al. | 5,910,727 A | 6/1999 | Fujihara et al. |
| 5,631,571 A | 5/1997 | Spaziani et al. | 5,916,689 A | 6/1999 | Collins et al. |
| 5,633,780 A | 5/1997 | Cronin | 5,923,177 A | 7/1999 | Wardwell |
| 5,640,101 A | 6/1997 | Kuji et al. | 5,926,028 A | 7/1999 | Mochizuki |
| 5,642,298 A | 6/1997 | Mallory et al. | 5,942,907 A | 8/1999 | Chiang |
| 5,644,248 A | 7/1997 | Fujimoto | 5,944,093 A | 8/1999 | Viswanath |
| 5,646,538 A | 7/1997 | Lide et al. | 5,945,836 A | 8/1999 | Sayre et al. |
| 5,653,939 A | 8/1997 | Hollis et al. | 5,949,383 A | 9/1999 | Hayes et al. |
| 5,656,942 A | 8/1997 | Watts et al. | 5,949,579 A | 9/1999 | Baker |
| 5,657,394 A | 8/1997 | Schwartz et al. | 5,952,842 A | 9/1999 | Fujimoto |
| 5,659,255 A | 8/1997 | Strid et al. | 5,959,461 A | 9/1999 | Brown et al. |
| 5,659,421 A | 8/1997 | Rahmel et al. | 5,960,411 A | 9/1999 | Hartman et al. |
| 5,663,653 A | 9/1997 | Schwindt et al. | 5,963,027 A | 10/1999 | Peters |
| 5,666,063 A | 9/1997 | Abercrombie et al. | 5,963,364 A | 10/1999 | Leong et al. |
| 5,668,470 A | 9/1997 | Shelor | 5,970,429 A | 10/1999 | Martin |
| 5,669,316 A | 9/1997 | Faz et al. | 5,973,505 A | 10/1999 | Strid et al. |

| | | | | | | |
|---|---|---|---|---|---|---|
| 5,974,662 | A | 11/1999 | Eldridge et al. | 6,211,837 B1 | 4/2001 | Crouch et al. |
| 5,981,268 | A | 11/1999 | Kovacs et al. | 6,215,295 B1 | 4/2001 | Smith, III |
| 5,982,166 | A | 11/1999 | Mautz | 6,222,031 B1 | 4/2001 | Wakabayashi et al. |
| 5,993,611 | A | 11/1999 | Moroney, III et al. | 6,222,970 B1 | 4/2001 | Wach et al. |
| 5,995,914 | A | 11/1999 | Cabot | 6,229,327 B1 | 5/2001 | Boll et al. |
| 5,996,102 | A | 11/1999 | Haulin | 6,232,787 B1 | 5/2001 | Lo et al. |
| 5,998,768 | A | 12/1999 | Hunter et al. | 6,232,788 B1 * | 5/2001 | Schwindt et al. ............ 324/754 |
| 5,999,268 | A | 12/1999 | Yonezawa et al. | 6,232,789 B1 | 5/2001 | Schwindt |
| 6,001,760 | A | 12/1999 | Katsuda et al. | 6,232,790 B1 | 5/2001 | Bryan et al. |
| 6,002,236 | A | 12/1999 | Trant et al. | 6,233,613 B1 | 5/2001 | Walker et al. |
| 6,002,263 | A | 12/1999 | Peters et al. | 6,236,223 B1 | 5/2001 | Brady et al. |
| 6,002,426 | A | 12/1999 | Back et al. | 6,236,975 B1 | 5/2001 | Boe et al. |
| 6,013,586 | A | 1/2000 | McGhee et al. | 6,236,977 B1 | 5/2001 | Verba et al. |
| 6,019,612 | A | 2/2000 | Hasegawa et al. | 6,242,929 B1 | 6/2001 | Mizuta |
| 6,023,209 | A | 2/2000 | Faulkner et al. | 6,245,692 B1 | 6/2001 | Pearce et al. |
| 6,028,435 | A | 2/2000 | Nikawa | 6,251,595 B1 | 6/2001 | Gordon et al. |
| 6,029,141 | A | 2/2000 | Bezos et al. | 6,252,392 B1 | 6/2001 | Peters |
| 6,031,383 | A | 2/2000 | Streib et al. | 6,257,319 B1 | 7/2001 | Kainuma et al. |
| 6,032,714 | A | 3/2000 | Fenton | 6,257,564 B1 | 7/2001 | Avneri et al. |
| 6,034,533 | A | 3/2000 | Tervo et al. | 6,259,261 B1 | 7/2001 | Engelking et al. |
| 6,037,785 | A | 3/2000 | Higgins | 6,265,950 B1 | 7/2001 | Schmidt et al. |
| 6,037,793 | A | 3/2000 | Miyazawa et al. | 6,271,673 B1 | 8/2001 | Furuta et al. |
| 6,043,667 | A | 3/2000 | Cadwallader et al. | 6,275,738 B1 | 8/2001 | Kasevich et al. |
| 6,043,668 | A | 3/2000 | Carney | 6,278,051 B1 | 8/2001 | Peabody |
| 6,049,216 | A | 4/2000 | Yang et al. | 6,278,411 B1 | 8/2001 | Ohlsson et al. |
| 6,051,422 | A | 4/2000 | Kovacs et al. | 6,281,691 B1 | 8/2001 | Matsunaga et al. |
| 6,052,653 | A | 4/2000 | Mazur et al. | 6,284,971 B1 | 9/2001 | Atalar et al. |
| 6,054,869 | A | 4/2000 | Hutton et al. | 6,288,557 B1 | 9/2001 | Peters et al. |
| 6,060,888 | A | 5/2000 | Blackham et al. | 6,292,760 B1 | 9/2001 | Burns |
| 6,060,891 | A | 5/2000 | Hembree et al. | 6,300,775 B1 | 10/2001 | Peach et al. |
| 6,060,892 | A | 5/2000 | Yamagata | 6,307,672 B1 | 10/2001 | DeNure |
| 6,061,589 | A | 5/2000 | Bridges et al. | 6,310,483 B1 | 10/2001 | Taura et al. |
| 6,064,213 | A | 5/2000 | Khandros et al. | 6,310,755 B1 | 10/2001 | Kholodenko et al. |
| 6,064,217 | A | 5/2000 | Smith | 6,313,649 B2 | 11/2001 | Harwood et al. |
| 6,064,218 | A | 5/2000 | Godfrey et al. | 6,320,372 B1 | 11/2001 | Keller |
| 6,066,911 | A | 5/2000 | Lindemann et al. | 6,320,396 B1 | 11/2001 | Nikawa |
| 6,078,183 | A | 6/2000 | Cole, Jr. | 6,327,034 B1 | 12/2001 | Hoover et al. |
| 6,091,236 | A | 7/2000 | Piety et al. | 6,335,625 B1 | 1/2002 | Bryant et al. |
| 6,091,255 | A | 7/2000 | Godfrey | 6,335,628 B2 | 1/2002 | Schwindt et al. |
| 6,096,567 | A | 8/2000 | Kaplan et al. | 6,340,568 B2 | 1/2002 | Hefti |
| 6,100,815 | A | 8/2000 | Pailthorp | 6,340,895 B1 | 1/2002 | Uher et al. |
| 6,104,203 | A | 8/2000 | Costello et al. | 6,359,456 B1 | 3/2002 | Hembree et al. |
| 6,104,206 | A | 8/2000 | Verkuil | 6,362,636 B1 | 3/2002 | Peters et al. |
| 6,111,419 | A | 8/2000 | Lefever et al. | 6,362,792 B1 | 3/2002 | Sawamura et al. |
| 6,114,865 | A | 9/2000 | Lagowski et al. | 6,366,247 B1 | 4/2002 | Sawamura et al. |
| 6,118,287 | A | 9/2000 | Boll et al. | 6,369,776 B1 | 4/2002 | Leisten et al. |
| 6,118,894 | A | 9/2000 | Schwartz et al. | 6,376,258 B2 | 4/2002 | Hefti |
| 6,121,783 | A | 9/2000 | Horner et al. | 6,380,751 B2 | 4/2002 | Harwood et al. |
| 6,124,723 | A | 9/2000 | Costello | 6,384,614 B1 | 5/2002 | Hager et al. |
| 6,124,725 | A | 9/2000 | Sato | 6,395,480 B1 | 5/2002 | Hefti |
| 6,127,831 | A | 10/2000 | Khoury et al. | 6,396,296 B1 | 5/2002 | Tarter et al. |
| 6,130,544 | A | 10/2000 | Strid et al. | 6,396,298 B1 | 5/2002 | Young et al. |
| 6,137,302 | A | 10/2000 | Schwindt | 6,400,168 B2 | 6/2002 | Matsunaga et al. |
| 6,137,303 | A | 10/2000 | Deckert et al. | 6,404,213 B2 | 6/2002 | Noda |
| 6,144,212 | A | 11/2000 | Mizuta | 6,407,560 B1 | 6/2002 | Walraven et al. |
| 6,147,502 | A | 11/2000 | Fryer et al. | 6,407,562 B1 | 6/2002 | Whiteman |
| 6,147,851 | A | 11/2000 | Anderson | 6,409,724 B1 | 6/2002 | Penny et al. |
| 6,160,407 | A | 12/2000 | Nikawa | 6,414,478 B1 | 7/2002 | Suzuki |
| 6,166,553 | A | 12/2000 | Sinsheimer | 6,415,858 B1 | 7/2002 | Getchel et al. |
| 6,169,410 | B1 | 1/2001 | Grace et al. | 6,418,009 B1 | 7/2002 | Brunette |
| 6,172,337 | B1 | 1/2001 | Johnsgard et al. | 6,420,722 B2 | 7/2002 | Moore et al. |
| 6,175,228 | B1 | 1/2001 | Zamborelli et al. | 6,424,141 B1 | 7/2002 | Hollman et al. |
| 6,176,091 | B1 | 1/2001 | Kishi et al. | 6,424,316 B1 | 7/2002 | Leisten et al. |
| 6,181,144 | B1 | 1/2001 | Hembree et al. | 6,445,202 B1 | 9/2002 | Cowan et al. |
| 6,181,149 | B1 | 1/2001 | Godfrey et al. | 6,447,339 B1 | 9/2002 | Reed et al. |
| 6,181,297 | B1 | 1/2001 | Leisten | 6,448,788 B1 | 9/2002 | Meaney et al. |
| 6,181,416 | B1 | 1/2001 | Falk | 6,459,739 B1 | 10/2002 | Vitenberg |
| 6,184,845 | B1 | 2/2001 | Leisten et al. | 6,468,816 B2 | 10/2002 | Hunter |
| 6,191,596 | B1 | 2/2001 | Abiko | 6,476,442 B1 | 11/2002 | Williams et al. |
| 6,194,720 | B1 | 2/2001 | Li et al. | 6,480,013 B1 | 11/2002 | Nayler et al. |
| 6,194,907 | B1 | 2/2001 | Kanao et al. | 6,481,939 B1 | 11/2002 | Gillespie et al. |
| 6,198,299 | B1 | 3/2001 | Hollman | 6,483,327 B1 | 11/2002 | Bruce et al. |
| 6,211,663 | B1 | 4/2001 | Moulthrop et al. | 6,483,336 B1 | 11/2002 | Harris et al. |

| | | | | | | |
|---|---|---|---|---|---|---|
| 6,486,687 B2 | 11/2002 | Harwood et al. | | 6,806,836 B2 | 10/2004 | Ogawa et al. |
| 6,488,405 B1 | 12/2002 | Eppes et al. | | 6,809,533 B1 | 10/2004 | Anlage et al. |
| 6,489,789 B1 | 12/2002 | Peters et al. | | 6,812,718 B1 | 11/2004 | Chong et al. |
| 6,490,471 B2 | 12/2002 | Svenson et al. | | 6,822,463 B1 | 11/2004 | Jacobs |
| 6,492,822 B2 | 12/2002 | Schwindt et al. | | 6,836,135 B2 | 12/2004 | Harris et al. |
| 6,501,289 B1 | 12/2002 | Takekoshi | | 6,838,885 B2 | 1/2005 | Kamitani |
| 6,512,482 B1 | 1/2003 | Nelson et al. | | 6,842,024 B2 * | 1/2005 | Peters et al. ................ 324/754 |
| 6,515,494 B1 | 2/2003 | Low | | 6,843,024 B2 | 1/2005 | Nozaki et al. |
| 6,528,993 B1 | 3/2003 | Shin et al. | | 6,847,219 B1 | 1/2005 | Lesher et al. |
| 6,529,844 B1 | 3/2003 | Kapetanic et al. | | 6,856,129 B2 | 2/2005 | Thomas et al. |
| 6,548,311 B1 | 4/2003 | Knoll | | 6,861,856 B2 | 3/2005 | Dunklee et al. |
| 6,549,022 B1 | 4/2003 | Cole, Jr. et al. | | 6,864,694 B2 | 3/2005 | McTigue |
| 6,549,026 B1 | 4/2003 | DiBattista et al. | | 6,873,167 B2 * | 3/2005 | Goto et al. ................ 324/754 |
| 6,549,106 B2 | 4/2003 | Martin | | 6,885,197 B2 | 4/2005 | Harris et al. |
| 6,566,079 B2 | 5/2003 | Hefti | | 6,900,646 B2 | 5/2005 | Kasukabe et al. |
| 6,573,702 B2 | 6/2003 | Marcuse et al. | | 6,900,647 B2 | 5/2005 | Yoshida et al. |
| 6,578,264 B1 | 6/2003 | Gleason et al. | | 6,900,652 B2 | 5/2005 | Mazur |
| 6,580,283 B1 | 6/2003 | Carbone et al. | | 6,900,653 B2 | 5/2005 | Yu et al. |
| 6,582,979 B2 | 6/2003 | Coccioli et al. | | 6,902,941 B2 | 6/2005 | Sun |
| 6,587,327 B1 | 7/2003 | Devoe et al. | | 6,903,563 B2 | 6/2005 | Yoshida et al. |
| 6,603,322 B1 | 8/2003 | Boll et al. | | 6,914,244 B2 | 7/2005 | Alani |
| 6,605,951 B1 | 8/2003 | Cowan | | 6,914,580 B2 | 7/2005 | Leisten |
| 6,605,955 B1 | 8/2003 | Costello et al. | | 6,927,079 B1 | 8/2005 | Fyfield |
| 6,608,494 B1 | 8/2003 | Bruce et al. | | 6,937,341 B1 | 8/2005 | Woollam et al. |
| 6,608,496 B1 | 8/2003 | Strid et al. | | 6,970,001 B2 | 11/2005 | Chheda et al. |
| 6,611,417 B2 | 8/2003 | Chen | | 6,987,483 B2 | 1/2006 | Tran |
| 6,617,862 B1 | 9/2003 | Bruce | | 7,001,785 B1 | 2/2006 | Chen |
| 6,621,082 B2 | 9/2003 | Morita et al. | | 7,002,133 B2 | 2/2006 | Beausoleil et al. |
| 6,624,891 B2 | 9/2003 | Marcus et al. | | 7,002,363 B2 | 2/2006 | Mathieu |
| 6,627,461 B2 | 9/2003 | Chapman et al. | | 7,002,364 B2 | 2/2006 | Kang et al. |
| 6,628,503 B2 | 9/2003 | Sogard | | 7,003,184 B2 | 2/2006 | Ronnekleiv et al. |
| 6,628,980 B2 | 9/2003 | Atalar et al. | | 7,005,842 B2 | 2/2006 | Fink et al. |
| 6,633,174 B1 | 10/2003 | Satya et al. | | 7,005,868 B2 | 2/2006 | McTigue |
| 6,636,059 B2 | 10/2003 | Harwood et al. | | 7,005,879 B1 | 2/2006 | Robertazzi |
| 6,636,182 B2 | 10/2003 | Mehltretter | | 7,006,046 B2 | 2/2006 | Aisenbrey |
| 6,639,415 B2 | 10/2003 | Peters et al. | | 7,007,380 B2 | 3/2006 | Das et al. |
| 6,639,461 B1 | 10/2003 | Tam et al. | | 7,009,188 B2 | 3/2006 | Wang |
| 6,642,732 B2 | 11/2003 | Cowan et al. | | 7,009,383 B2 | 3/2006 | Harwood et al. |
| 6,643,597 B1 | 11/2003 | Dunsmore | | 7,009,415 B2 | 3/2006 | Kobayashi et al. |
| 6,653,903 B2 | 11/2003 | Leich et al. | | 7,011,531 B2 | 3/2006 | Egitto et al. |
| 6,657,601 B2 | 12/2003 | McLean | | 7,012,425 B2 | 3/2006 | Shoji |
| 6,686,753 B1 | 2/2004 | Kitahata | | 7,012,441 B2 | 3/2006 | Chou et al. |
| 6,701,265 B2 | 3/2004 | Hill et al. | | 7,013,221 B1 | 3/2006 | Friend et al. |
| 6,707,548 B2 | 3/2004 | Kreimer et al. | | 7,014,499 B2 | 3/2006 | Yoon |
| 6,710,798 B1 | 3/2004 | Hershel et al. | | 7,015,455 B2 | 3/2006 | Mitsuoka et al. |
| 6,717,426 B2 | 4/2004 | Iwasaki | | 7,015,689 B2 | 3/2006 | Kasajima et al. |
| 6,720,782 B2 | 4/2004 | Schwindt et al. | | 7,015,690 B2 | 3/2006 | Wang et al. |
| 6,724,205 B1 | 4/2004 | Hayden et al. | | 7,015,703 B2 | 3/2006 | Hopkins et al. |
| 6,724,928 B1 | 4/2004 | Davis | | 7,015,707 B2 | 3/2006 | Cherian |
| 6,727,716 B1 | 4/2004 | Sharif | | 7,015,708 B2 | 3/2006 | Beckous et al. |
| 6,731,804 B1 | 5/2004 | Carrieri et al. | | 7,015,709 B2 | 3/2006 | Capps et al. |
| 6,734,687 B1 | 5/2004 | Ishitani et al. | | 7,015,710 B2 | 3/2006 | Yoshida et al. |
| 6,737,920 B2 | 5/2004 | Jen et al. | | 7,015,711 B2 | 3/2006 | Rothaug et al. |
| 6,739,208 B2 | 5/2004 | Hyakudomi | | 7,019,541 B2 | 3/2006 | Kittrell |
| 6,744,268 B2 | 6/2004 | Hollman | | 7,019,544 B1 | 3/2006 | Jacobs et al. |
| 6,753,679 B1 | 6/2004 | Kwong et al. | | 7,019,701 B2 | 3/2006 | Ohno et al. |
| 6,753,699 B2 | 6/2004 | Stockstad | | 7,020,360 B2 | 3/2006 | Satomura et al. |
| 6,756,751 B2 | 6/2004 | Hunter | | 7,020,363 B2 | 3/2006 | Johannessen |
| 6,768,328 B2 | 7/2004 | Self et al. | | 7,022,976 B1 | 4/2006 | Santana, Jr. et al. |
| 6,770,955 B1 | 8/2004 | Coccioli et al. | | 7,022,985 B2 | 4/2006 | Knebel et al. |
| 6,771,090 B2 | 8/2004 | Harris et al. | | 7,023,225 B2 | 4/2006 | Blackwood |
| 6,771,806 B1 | 8/2004 | Satya et al. | | 7,023,226 B2 | 4/2006 | Okumura et al. |
| 6,774,651 B1 | 8/2004 | Hembree | | 7,023,229 B2 | 4/2006 | Maesaki et al. |
| 6,777,964 B2 | 8/2004 | Navratil et al. | | 7,023,231 B2 | 4/2006 | Howland, Jr. et al. |
| 6,778,140 B1 | 8/2004 | Yeh | | 7,025,628 B2 | 4/2006 | LaMeres et al. |
| 6,784,679 B2 | 8/2004 | Sweet et al. | | 7,026,832 B2 | 4/2006 | Chaya et al. |
| 6,788,093 B2 | 9/2004 | Aitren et al. | | 7,026,833 B2 | 4/2006 | Rincon et al. |
| 6,791,344 B2 * | 9/2004 | Cook et al. ................ 324/754 | | 7,026,834 B2 | 4/2006 | Hwang |
| 6,794,888 B2 | 9/2004 | Kawaguchi et al. | | 7,026,835 B2 | 4/2006 | Farnworth et al. |
| 6,794,950 B2 | 9/2004 | Du Toit et al. | | 7,030,599 B2 | 4/2006 | Douglas |
| 6,798,226 B2 | 9/2004 | Altmann et al. | | 7,030,827 B2 | 4/2006 | Mahler et al. |
| 6,801,047 B2 | 10/2004 | Harwood et al. | | 7,032,307 B2 | 4/2006 | Matsunaga et al. |
| 6,806,724 B2 | 10/2004 | Hayden et al. | | 7,034,553 B2 | 4/2006 | Gilboe |

| | | |
|---|---|---|
| 7,035,738 B2 | 4/2006 | Matsumoto et al. |
| 7,088,981 B2 | 8/2006 | Chang |
| 7,096,133 B1 | 8/2006 | Martin et al. |
| 7,101,797 B2 | 9/2006 | Yuasa |
| 7,187,188 B2 | 3/2007 | Andrews et al. |
| 7,188,037 B2 | 3/2007 | Hidehira |
| 2001/0002794 A1 | 6/2001 | Draving et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0066551 A1 | 6/2002 | Stone et al. |
| 2002/0070743 A1 | 6/2002 | Felici et al. |
| 2002/0070745 A1 | 6/2002 | Johnson et al. |
| 2002/0075027 A1 | 6/2002 | Hollman et al. |
| 2002/0079911 A1 | 6/2002 | Schwindt |
| 2002/0118009 A1 | 8/2002 | Hollman et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0071631 A1 | 3/2003 | Leedy |
| 2003/0062915 A1 | 4/2003 | Arnold et al. |
| 2003/0072549 A1 | 4/2003 | Facer et al. |
| 2003/0073575 A1 | 4/2003 | Alexander |
| 2003/0077649 A1 | 4/2003 | Cho et al. |
| 2003/0088180 A1 | 5/2003 | VanVeen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0141861 A1 | 7/2003 | Navratil et al. |
| 2003/0155939 A1 | 8/2003 | Lutz et al. |
| 2003/0156270 A1 | 8/2003 | Hunter |
| 2003/0170898 A1 | 9/2003 | Gunderson et al. |
| 2003/0184332 A1 | 10/2003 | Tomimatsu et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113639 A1 | 6/2004 | Dunklee et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0147034 A1 | 7/2004 | Gore et al. |
| 2004/0162689 A1 | 8/2004 | Jamneala et al. |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0247691 A1 | 12/2004 | Vasudeva |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0083130 A1 | 4/2005 | Grilo |
| 2005/0099192 A1* | 5/2005 | Dunklee et al. ............. 324/754 |
| 2005/0101846 A1 | 5/2005 | Fine et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0174191 A1 | 8/2005 | Brunker et al. |
| 2005/0178980 A1 | 8/2005 | Skidmore et al. |
| 2005/0195124 A1 | 9/2005 | Ballarda et al. |
| 2005/0227503 A1 | 10/2005 | Reitinger |
| 2005/0236587 A1 | 10/2005 | Kodama et al. |
| 2005/0237102 A1 | 10/2005 | Tanaka |
| 2006/0052075 A1 | 3/2006 | Galivanche et al. |
| 2006/0114012 A1 | 6/2006 | Reitinger |
| 2006/0155270 A1 | 7/2006 | Hancock et al. |
| 2006/0158207 A1 | 7/2006 | Reitinger |
| 2006/0226864 A1 | 10/2006 | Kramer |
| 2007/0024506 A1 | 2/2007 | Hardacker |
| 2007/0030021 A1 | 2/2007 | Cowan et al. |

FOREIGN PATENT DOCUMENTS

| | | |
|---|---|---|
| DE | 29 12 826 | 10/1980 |
| DE | 31 14 466 | 3/1982 |
| DE | 31 25 552 | 11/1982 |
| DE | 3637549 | 5/1988 |
| DE | 41 09 908 | 10/1992 |
| DE | 43 16 111 | 11/1994 |
| DE | 195 41 334 | 9/1996 |
| DE | 196 16 212 | 10/1996 |
| DE | 19592774 | 1/1997 |
| DE | 196 18 717 | 1/1998 |
| DE | 10000324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 A1 | 5/1993 |
| EP | 0 574 149 | 12/1993 |
| EP | 0 706 210 | 4/1996 |
| EP | 0 505 981 | 6/1998 |
| EP | 0 573 183 | 1/1999 |
| EP | 0 945 736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-11243 | 1/1987 |
| JP | 62-011243 | 1/1987 |
| JP | 62-51235 | 3/1987 |
| JP | 62-098634 | 5/1987 |

| | | |
|---|---|---|
| JP | 62-107967 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-082631 | 4/1993 |
| JP | 5-157790 | 6/1993 |
| JP | 51-57790 | 6/1993 |
| JP | 5-166893 | 7/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-12871 | 1/1995 |
| JP | 7005078 | 1/1995 |
| JP | 8-35987 | 2/1996 |
| JP | 8-261898 | 10/1996 |
| JP | 8-330491 | 12/1996 |
| JP | 10-116866 | 5/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002033374 | 1/2002 |
| JP | 2002-164396 | 6/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.
Cascade Microtech, "Introducing the peak of analytical probe stations," MicroProbe Update, May 1990.
H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publications Limited, Sep. 12-16, 1988, Stockholm, Sweden.
Cascade Microtech, "Analytical Probe Station," Summit 9000 Series, Jun. 1, 1990.
Maury Microwave Corporation, "MT950D Series, Transistor Test Fixture Software, Software Application Packs," Sep. 20, 1982.
Signatone S-1240 Thermal Controller, 2 page description.
Eric Phizicky, Philippe I.H. Bastiaens, Heng Zhu, Michael Snyder, & Stanley Fields, "Protein analysis on a proteomic scale," Nature 422, insight: review article, Mar. 13, 2003.
The Micromanipulator Company, "Semi-Automatic Probing Stations and Accessories," pp. 1-12.
Integrated Technology Corporation, "Probilt PB500A Probe Card Repair and Analysis Station," 4 pages.
Brian J. Clifton, "Precision slotted-Line Impedance Measurements Using computer Simulation for Data Correction," IEEE Transactions on Instrumentation and Measurement, vol IM-19, No. 4, Nov. 1970, pp. 358-363.
Eric Strid (Cascade Microtech), "Planar Impedance Standards and Accuracy Considerations in Vector Network Analysis," Jun. 1986, 6 pages.
J. Martens, Anritsu Company, 490 Jarvis Drive, Morgan Hill, CA 95037, "Multiport SOLR Calibrations: Performance and an Analysis of some Standards Dependencies," pp. 205-213.
Maury Microwave Corporation, "MT950 Series Transistor Test Fixture (TTF) Notice! Notice! Notice!," May 31, 1985.
Maury Microwave Corporation, MT950 Series Transistor Text Fixture (TTF), Oct. 7, 1982, 4 pages.
Temptronic Corporation, "Model TPO3000 Series ThermoChuck Systems for Probing, Characterization and Failure analysis of Wafers, Chips and Hybrids at High and Low Temperatures," pp. 2-5.
Cascade Microtech, "Model 42/42D Microwave Probe Station Instruction Manual, Electrical Operation," pp. 4-1-4-42.
Inter-Continental Microwave, "Microwave Semiconductor Chip Measurements using the HP 8510B TRL-Calibration Technique," Application Note: 101.
Design Technique, "Microstrip Microwave Test Fixture," May 1986, 2 pages.
Photo: Micromanipulator Probe Station 1994.
Micromanipulator Sales and Services Inc., "Test Station Accessories," Copyright 1983, 1984, 1 page.
Ruedi Aebersold & Matthias Mann, "Insight Review Articles, Mass spectrometry-based proteomics," Nature, vol. 422, Mar. 13, 2003, pp. 198-207.
Keithley Instruments, Inc. "Low-Level Measurements for Effective Low Current, Low Voltage, and High Impedance Measurements," Revised Third Edition, Printed Jun. 1984.
Inter-Continental Microwave, 2370-B Walsh Avenue, Santa Clara, CA 95051, "Product Catalog."
Hewlett Packard, "HP 4284A Practice LCR Meter Operation Manual (Including Option 001,002,006,201,202,301)," Third Edition, Dec. 1991, pp. 2-1, 6-9, 6-15.
Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.
Cascade Microtech Technical Brief, A Guide to Better Vector Network Analyzer Calibrations for Probe-Tip Measurements, Copyright 1994, 2 pages.
Temptronic, "Guarded" Chuck Sketch, Nov. 15, 1989.
Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.
Andrej Sali, Robert Glaeser, Thomas Earnest & Wolfgang Baumeister, "From words to literature in structural proteomics," Insight: Review Article, Nature 422, pp. 216-225, Mar. 13, 2003.
Mike Tyers & Matthias Mann, "From genomics to proteomics," Insight overview, Nature vol. 422 Mar. 2003, pp. 193-197.
William Knauer, "Fixturing for Low-Current/Low-Voltage Parametric Testing," Evaluation Engineering, Nov. 1990, pp. 9-12.

J.D. Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Sam Hanash, "Disease proteomics," Insight Review Articles, Nature, vol. 422, Mar. 13, 2003, pp. 226-232.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross.Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between -196 and 350° C.," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 page, 8505 SE 68th Street, Mercer Island, Washington 98040.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20, Sep. 26, 2000, pp. 10687-10690.

Daniel Van Der Weide, "THz Frequency Science & Technology Biomolecular Interaction Sensing with Sub-Terahertz Fields," University of Wisconsin-Madison, 2 pages.

Mark S. Boguski & Martin W. McIntosh, "Biomedical Informatics for proteomics," Insight: review article, Nature 422, Mar. 13, 2003, pp. 233-237.

Saswata Basu & Reed Gleason, "A Membrane Quadrant Probe for R&D Applications," Cascade Microtech, Inc. 14255 SW Brigadoon Ct., Beaverton, OR 97005, 3 pages.

The Micromanipulator Company, Inc., "Model 8000 Test Station," 1986, 1 page.

The Micromanipulator Company, Inc. "Model 8000 Test Station," 1988, 1 page.

"Vacuum," Mechanical Operation, pp. 3-8-3-9.

The Micromanipulator Company, Inc., "Accessories: Hot and Hot/Cold Chucks, Integrated Dry environments, Triaxial chucks, Integrated Shielded and Dark environments, Probe Card Holders," p. 8.

Microwave Products, Microwave Journal, Sep. 1988, 1 page.

Cascade Microtech, "Advanced On-Wafer Device Characterization Using the Summit 10500," pp. 2-20.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DC source/Monitor Practical Applications—High Speed DC Characterization of Semiconductor Devices from Sub pA to 1A," Nov. 1987, pp. 1-4.

Doug Rytting, "Appendix to Analysis of Vector Measurement Accuracy Enhancement Techniques," pp. 1-42, Hewlett Packard.

Temptronic Corporation, "Application Note 1 Controlled Environment Enclosure For low temperature wafer probing in a moisture-free environment," 2 pages.

*Cascade Microtech, Inc.* vs. *Micromanipulator Company, Inc.*, "Deposition of Harry F. Applebay," United States District Court for the District of Oregon, Lead Case No. 97-479-AI.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

Mark S. Boguski and Martin W. McIntosh, "Biomedical informatics for proteomics," Insight: review article, Nature 422, 233-237 (2003); dol:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS, Sep. 26, 2000, vol. 97, No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003): doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor; "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Institute of Physics, pp. 1354-1356.

* cited by examiner

SWITCHED SUSPENDED CONDUCTOR AND CONNECTION

CROSS-REFERENCE TO RELATED APPLICATIONS

This application is a continuation of U.S. patent application Ser. No. 10/794,511, filed Mar. 5, 2005, now U.S. Pat No. 7,221,172; and which claims priority to U.S. Provisional App. No. 60/468,851, filed May 6, 2003.

BACKGROUND OF THE INVENTION

The present invention relates to a wafer assembly having a switch mechanism that, in one embodiment, selectively and alternately electrically connects a suspended element or connection with the probe assembly.

Testing of electrical devices is accomplished by routing a test signal through a probe assembly to selected contact points on a device under test (DUT). Measurement devices are then used to determine the voltages and/or currents generated in the DUT in response to that test signal.

When probing a DUT, it is highly desirable to protect the probe assembly from electrical interference that can result, for example, from dynamic electromagnetic fields present in the immediate vicinity of the probe assembly. To reduce this type of interference, probe assemblies commonly provide the test signal through a coaxial or triaxial cable so that the test signal may be guarded and/or shielded. In this arrangement, the center conductor of the coaxial or triaxial cable carries the test signal. A guard signal, preferably substantially identical to the test signal, or otherwise "follows" the test signal, is routed through either the outer conductor of a coaxial cable, or the middle conductor of a triaxial cable. If a triaxial cable is employed, a shield signal, which is typically instrumental "ground" or another relatively constant potential, may be provided through the outer conductor.

The DUT typically rests upon the top layer of a multilayer electrically conductive chuck where each layer is insulated from the others. The guard may be connected to the second layer of the chuck and, if desired, a conductive plate may laterally surround the chuck. The shield may be connected to the third layer of the chuck.

It is desirable to closely match the signals between the test signal and the guard. Because the shield is exposed to external interference along its outer periphery it will not ordinarily match precisely the guard signal it encloses. The resulting discrepancy between the shield and guard signals permits some interference to affect the guard signal. The modified guard signal in turn affects the test signal. Usually, the resulting interference is insignificant. However, when the test signal to the DUT is very small, even this amount of interference can be significant.

When small amounts of interference are significant, further reduction in the interference can be obtained by locating a suspended conductive plate over the DUT and connecting it to the guard signal. The suspended conductive plate defines a central opening so that the probe assembly may make electrical contact with the DUT. In this fashion, the DUT may be guarded from all sides by signals closely approximating that delivered to the DUT.

Another problem that occurs when testing a DUT with a probing assembly is that chuck and/or cable impedances can often inhibit accurate measurement of the voltages and/or currents present in response to the applied test signal. This problem is particularly prevalent with high-current test signals where the voltage drop along the cable and/or through the chuck can be significant.

The typical adaptation to this problem is to connect a second coaxial or triaxial cable to the probe assembly in the same manner as the first. In this two-cable configuration, commonly referred to as a Kelvin connection, one cable provides the "force" (e.g. a low impedance connection that primarily supplies a current) while the other cable provides a "sense" (e.g. a high impedance connection that primarily senses a voltage) used to measure the resulting voltages and/or currents present within the DUT. In a "true" Kelvin connection, both the force and the sense comprise independent paths from the test equipment to the DUT. Alternatively, both the force and the sense lines may be connected at a common interconnection point, that is as close to the DUT as possible, frequently referred to as a quasi-Kelvin connection.

Designing a probe assembly that provides both a suspended guard and a Kelvin connection has recently become problematical because of the total capacitance seen by the measurement equipment. Measurement equipment that is used in conjunction with the probe assembly only provides valid measurements so long as total circuit capacitance remains within specified parameters. In addition, testing equipment imposes capacitance restrictions between the force and guard, and the guard and shield, respectively.

Historically, probe assemblies containing both a suspended guard and a Kelvin connection could be designed within the capacitance limitations set by the testing equipment. In recent years, the industry has moved towards manufacturing individual electrical devices, such as silicon semiconductor components, on a larger-sized 12" wafer. Any probe assembly that tests a DUT on such a wafer must therefore have a larger chuck, which adds capacitance to the probe assembly. The available capacitance permitted to be connected to the instrumentation that is not used by the chuck now must be rationed carefully. Both a suspended guard and a Kelvin connection add capacitance to the test circuit loop, and it has proven difficult to design a probe assembly that contains both elements, yet remains within the capacitance restrictions set by the measurement equipment.

What is desired, therefore, is a probe assembly that may accurately test electrical components and that includes a suspended guard and another connection.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

Figure 1:
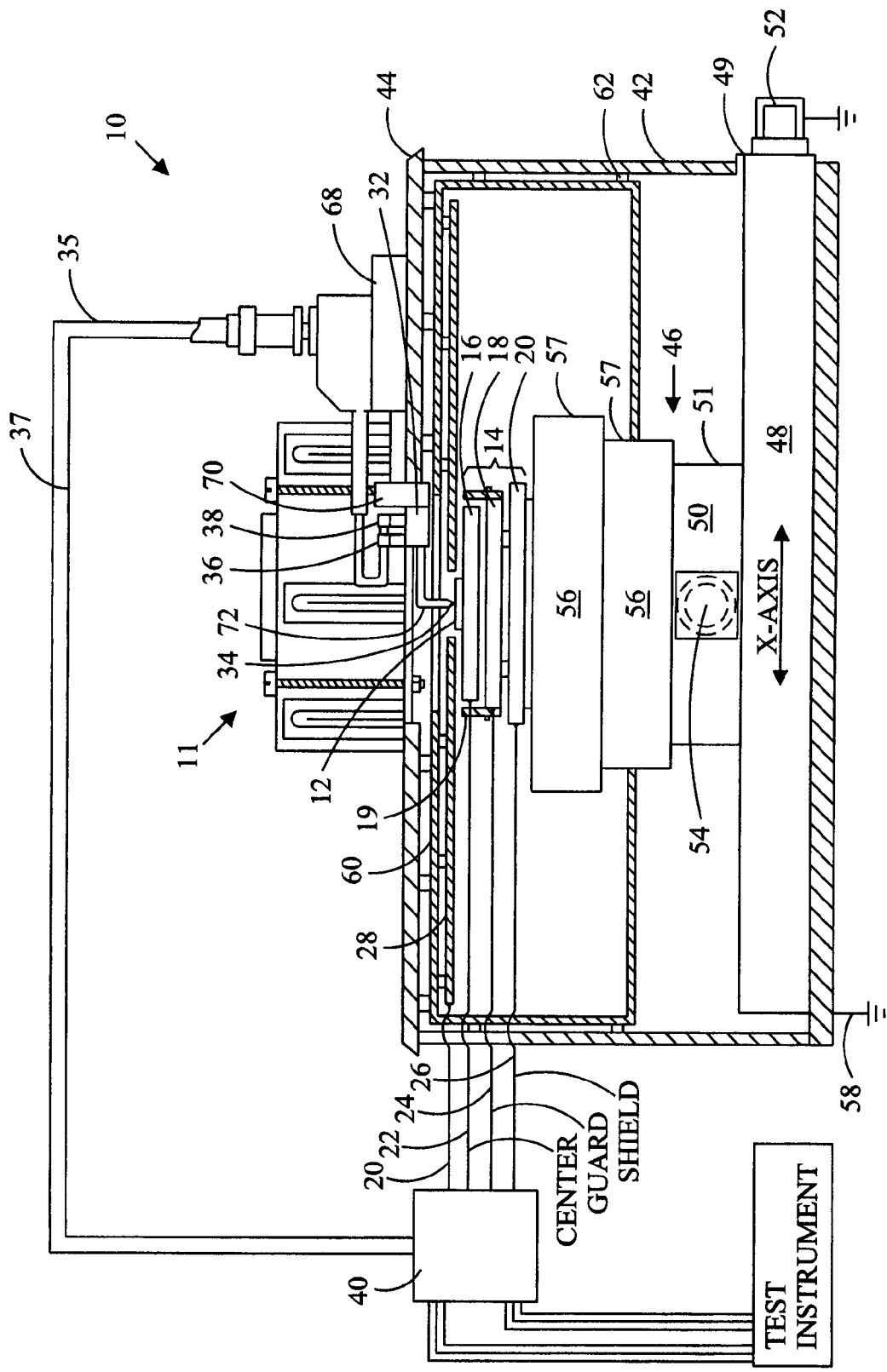
FIG. 1 shows a cross-sectional view of a probe assembly that includes a Kelvin connection, a suspended guard element and a switching mechanism between the connection and suspended guard.

FIG. 1 shows a probe station 10 having a probe assembly 11 and a multilayered chuck assembly 14 that may be used to probe an electrical device 12. The chuck assembly 14 includes a top stage 16 that is electrically connected to a center signal 22. The center signal 22 may be the test signal return path to the signal delivered to the electrical device 12 when probed by probe assembly 11. To reduce electrical noise when the electrical device 12 is probed by the probe assembly 11, the chuck assembly 14 also includes a center layer 18 that is electrically connected to a guard signal 24, and a bottom layer 20 that is electrically connected to a shield signal 26. The guard signal 24 may approximate the signal delivered to the electrical device 12 when probed. Some probe assemblies, like that disclosed in Peters et al., U.S. Pat. No. 6,002,263, utilize a variable shield signal which may be switched to other electric potentials. The manner in which center, guard, and shield signals are connected to their respective chuck stages is well known in industry, as disclosed for example, by Schwindt et al., U.S. Pat. No. 5,434,512.

The guard signal 24 may also be connected to a ring-shaped enclosure 19 that surrounds the top layer 16 and the middle layer 18 of the chuck assembly 14 along with the electrical device 12 being probed. In instances where further reduction in noise is desired, the probe assembly 10 includes a conductive guard element 28 positioned over the electrical device 12 being probed. The guard element 28, along with the center signal 22, the guard signal 24, and the shield signal 26 are electrically connected to a switching mechanism 40. It is to be understood that the suspended guard 28 may be merely vertically spaced apart from the DUT, whether above or below the chuck. Preferably, the suspended guard 28 is at least partially horizontally overlapping with the chuck and/or DUT supported by the chuck (but need not be). More preferably, the suspended guard is horizontally overlapping with the chuck and/or DUT supported by the chuck over a major portion of the chuck and/or DUT, respectively.

The probe assembly 11 includes a probe 32 having a probe end 34 that contacts the electrical device 12 when probed. The probe 32 separately routes a force signal provided along a first electrical path 35 to a force connection 36 and a sense signal provided along a second electrical path 37 from a sense connection 38 to the probe end 34. As seen in FIG. 1, both the force signal provided along the electrical path 35 and the sense signal provided along the electrical path 37 are electrically connected to the switching mechanism 40.

Figure 2:
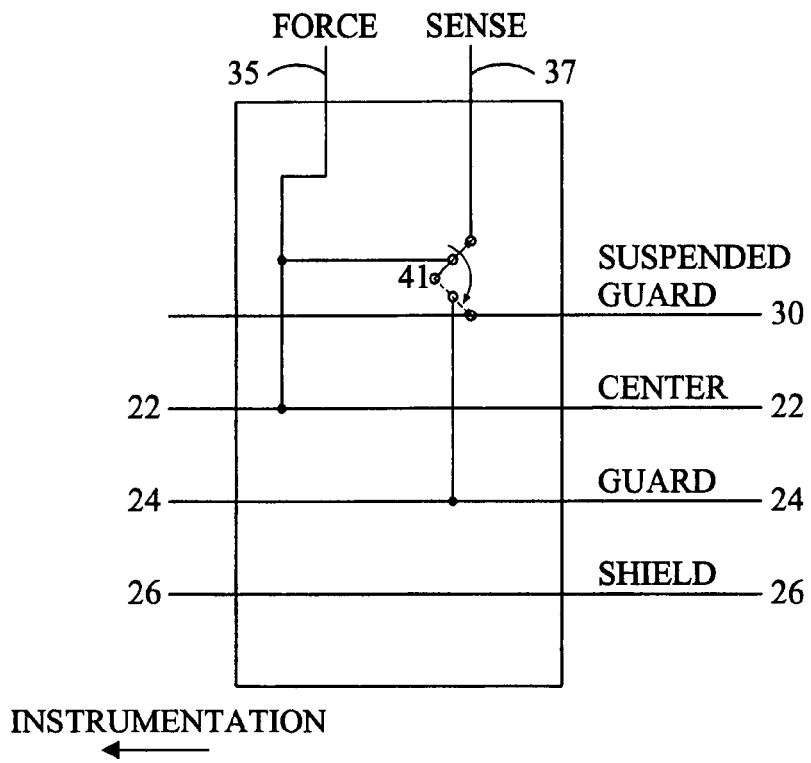
FIG. 2 shows a schematic for the switching mechanism shown in FIG. 1.

Referring to FIG. 2, the switching mechanism 40 receives the center signal 22, the guard signal 24, and the shield signal 26 from test instrumentation (not shown). The switching mechanism 40 routes signals to appropriate portions of the probe assembly 10. Referring also to FIG. 1, the center signal 22 is routed to the top layer 16 of the chuck assembly 14, and the force connection 36 of the probe 32 is routed through the force connection 35. The guard signal 24 is routed to the center layer 18 of the chuck assembly 14 and the ring-shaped enclosure 19. The shield signal 26 is routed to the bottom layer 20 of the chuck assembly 14 and an inner shield enclosure 60 surrounding the chuck assembly 14.

Because of capacitance constraints imposed by test instrumentation, difficulties have been encountered when attempting to probe a device using a probe assembly containing both a Kelvin connection and a suspended guard element. A suspended guard element is normally required when a low-current test signal is employed along a single cable to make measurements, such as the sense connection of a Kelvin connection. The present inventors realized that the suspended guard element may not be necessary when the system is making Kelvin measurements because in contrast, a force connection typically uses a high-current test signal. Based upon this realization, the present inventors recognized the potential advantage of a probe station that includes a switch that selectively connects the force connection while disconnecting the suspended guard element when taking Kelvin (or quasi-Kelvin) measurements, and disconnects the sense connection while connecting the suspended guard element for non-Kelvin measurements. In other words, the switch selectively connects one of the cables (force or sense) for testing while disconnecting the suspended guard, and vice versa. In this manner, the additional capacitance of the suspended guard may be selectively removed from the signal path when its benefits are minimal. It is likewise to be understood that the switch mechanism may take the form of one or more switches that alone or in combination result in selectively adding or removing a signal path during testing while also correspondingly removing and adding, respectively, the suspended guard to the signal path. While the switching may be performed by activating a single switch(s) which performs the changes simultaneously (or substantially simultaneously) the changes may be manual, mechanical, and/or electrical. Further, the suspended plate need not necessarily be connected to guard, and as such may be connected to the signal, the shield, permitted to float, grounded, or otherwise. Moreover, the switching mechanism may likewise be useful for non-Kelvin testing. Further, the force, sense, or otherwise may be connected to the DUT, chuck, or otherwise, as desired.

As shown in FIG. 2, a switch 41 permits the probe station to be operated in two modes. In the first mode, the switch 41 electrically connects the center signal 22 to the sense connection 38 through the sense path 37. In this first mode, the electrical path 30 to the suspended guard 28 is electrically disconnected from the test instrumentation. In the second mode, the switch 41 electrically connects the guard signal 24 to the suspended guard 28 through the electrical path 30. In the second mode, the sense connection 38 is electrically disconnected from the test instrumentation. Accordingly, the center signal 22 may be used for testing purposes, if desired.

It is to be understood that more than one guard path or potential may be provided to the probe station, such as for example, a separate guard for the force and sense. Also, one or more test instruments may be used, collectively referred to as the test instrument. In addition, it may be advantageous under different circumstances to merely include a switch mechanism for the suspended guard to permit selectively including its respective capacitance in the signal path of the test instrument for any one or more channels.

Chuck Enclosure

A chuck assembly 14 for supporting a test device is laterally positionable by a chuck positioner assembly 46 having an orthoganally arranged lateral X-axis positioner 48 and Y-axis positioner 50. The lateral X-axis positioner 48 has a laterally extending positioning screw (not shown) driven by an electric motor 52. The X-axis positioner is partially enclosed by a conductive housing 49 and optionally also by flexible pleated rubber boots (not shown) for accommodating positioning movements while preventing the entry of dirt particles. The X-axis positioner 48 selectively moves a Y-axis positioner 50, oriented perpendicularly to the X-axis positioner 48.

The lateral Y-axis positioner 50 is constructed similarly to the X-axis positioner 48, and includes an outer conductive housing 51 with optional flexible pleated rubber boots (not shown). The conductive housing 51 is electrically connected to the conductive housing 49 of the X-axis positioner. A motor 54 provides for adjustable movement of the Y-axis positioner.

A conventional Z-axis positioner 56, having a conductive outer housing 57 electrically connected to the conductive housing 51 of the Y-axis positioner 50 is moveable along the Y-axis by the Y-axis positioner 50. The Z-axis positioner includes respective internal electric motors and plunger assemblies (not shown) to effect vertical movement with respect to the X-axis positioner 48 and the Y-axis positioner 50. Such mechanisms are well known and used in existing probe assemblies, as shown for example, by Peters et al., U.S. Pat. No. 6,002,263.

The outer conductive enclosure 42 is connected by a low impedance path 58 directly to AC ground. Collectively, the outer enclosure 42, a platen 44, and the conductive housings 49, 51, and 57 cooperate to provide an electrically conductive outer shield enclosure which helps to insulate the chuck assembly from environmental noise sources located externally of the enclosure 42 or internally within the positioner housings from motors, etc.

An electrically conductive inner shield enclosure 60, which also preferably acts as the probe station's environmental control enclosure not only for purposes of EMI shielding but also for purposes of maintaining a dry and/or dark environment, is mounted by dielectric spacers 62 to the interior of the outer enclosure 42 so as to be interposed between and insulated from the outer enclosure 42 and the top layer 16 and center layer 18 of the chuck assembly 14. In this fashion, the outer shield components 42, 44, 49, 51, and 57 protect the inner shield 60 from external noise sources so that the inner shield 60, in turn, can minimize noise-induced spurious currents affecting the top layer 16 and center layer 18 of the chuck assembly 14, and thereby maximize the accuracy of the test measurements.

Probe Assembly

Figure 3:
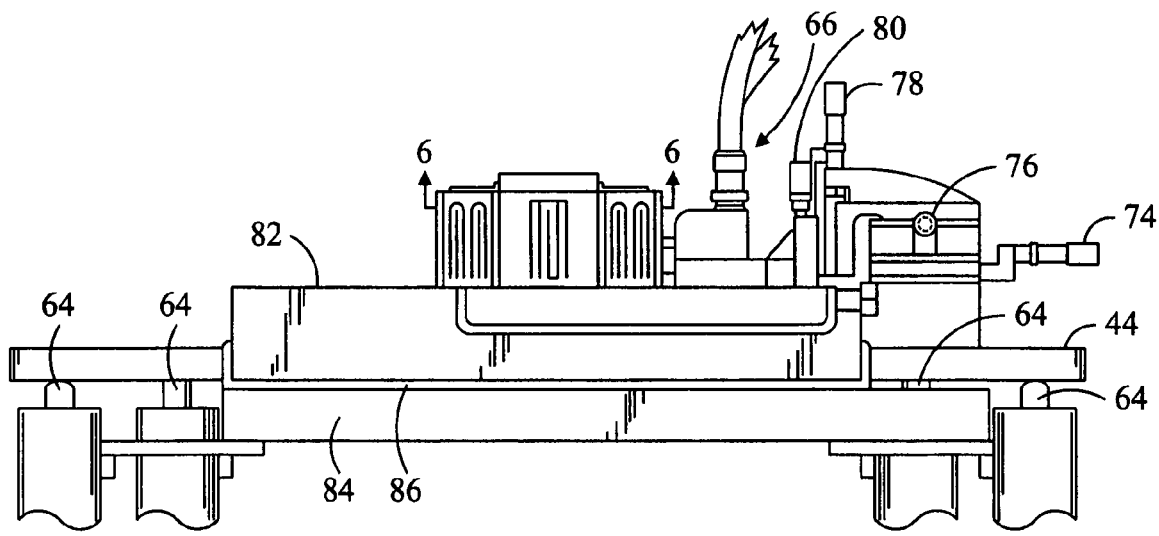
FIG. 3 shows a front view of an alternate embodiment of the top portion of the probe assembly shown in FIG. 1.
Figure 4:
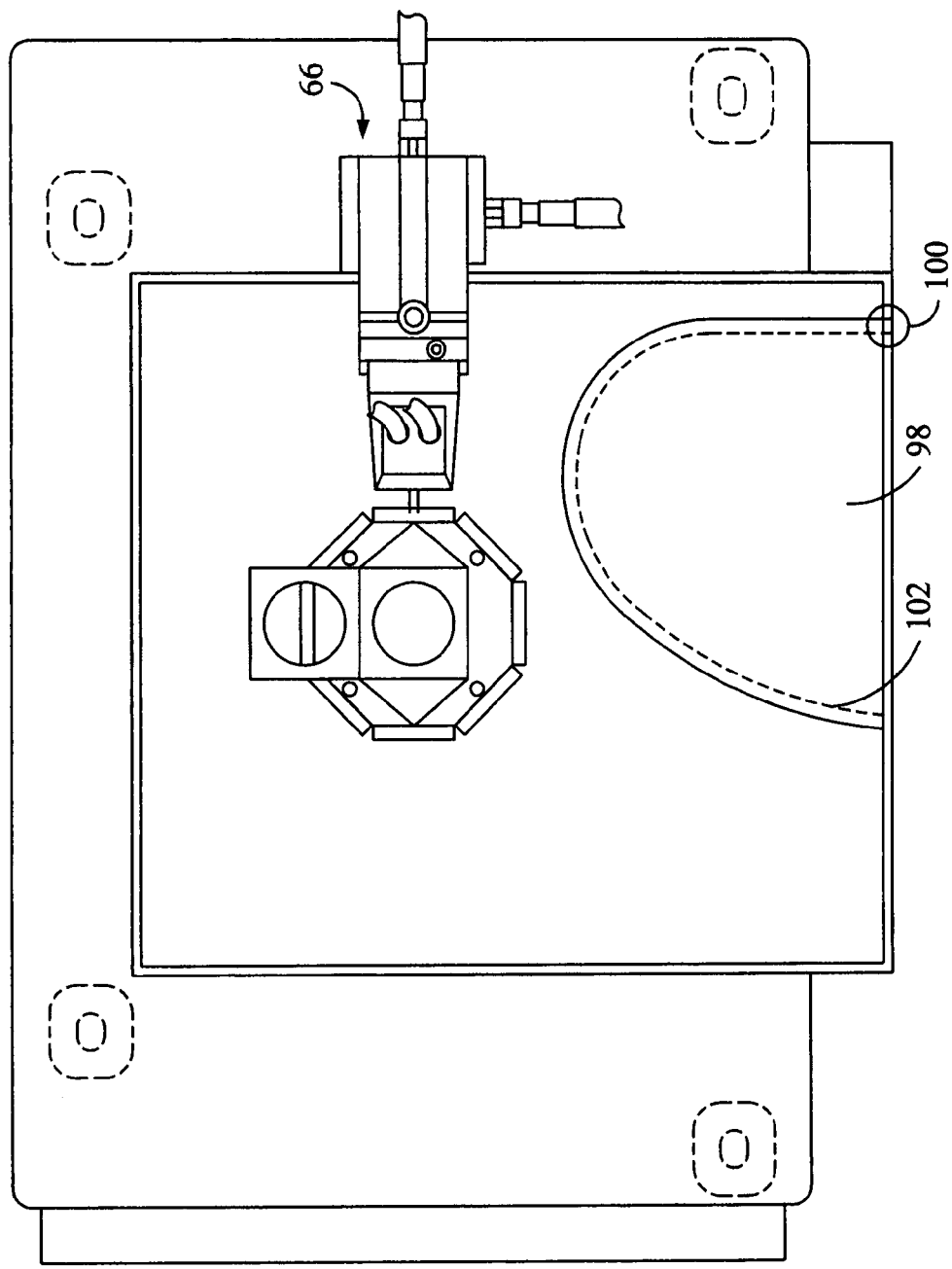
FIG. 4 shows a top view of the probe assembly shown in FIG. 1.

Referring to FIGS. 1, 3, and 4, the probe station 10 includes the electrically conductive outer enclosure 42 including the conductive platen 44 electrically connected thereto. The platen 44 may be supported by a series of jacks 64 that selectively raise and lower the platen vertically by a small increment (approximately one-tenth of an inch). The platen 44, when moved vertically by the jacks 64, move independently of the chuck assembly 14 and the chuck assembly positioner 46.

Mounted atop the platen 44 are multiple individual probe positioners such as 66 (only one of which is shown), each having an extending member 68 to which is mounted a probe holder 70 which in turn supports a respective probe 72 for contacting wafers and other test devices mounted atop the chuck assembly 14. The probe positioner 66 has micrometer adjustments 74, 76 and 78 for adjusting the position of the probe holder 70, and thus the probe 72 along the X, Y and Z axes, respectively, relative to the chuck assembly 14. The Z axis is exemplary of what is referred to herein loosely as the "axis of approach" between the probe holder 70 and the chuck assembly 14, although directions of approach which are neither vertical not linear, along which the probe tip and wafer or other test device are brought into contact with each other, are also intended to be included within the meaning of the term "axis of approach." A further micrometer adjustment 80 adjustably tilts the probe holder 70 to adjust planarity of the probe with respect to the wafer or other test device supported by the chuck assembly 14. As many as twelve (or more) individual probe positioners 66, each supporting a respective probe, may be arranged on the platen 44 around the chuck assembly 14 so as to converge radially toward the chuck assembly 14 similarly to the spokes of a wheel. With such an arrangement, each individual positioner 66 can independently adjust its respective probe in the X, Y and Z directions, while the jacks 64 can be actuated to raise or lower the platen 44 and thus all of the positioners and their respective probes in unison.

The environment control enclosure is composed of an upper box portion 82 rigidly attached to the platen 44 and a lower box portion 84 rigidly attached to the conductive outer enclosure 42 of the chuck assembly 14. Both the upper box portion 92 and the lower box portion 84 are made of steel or other suitable electrically conductive material to provide EMI shielding. To accommodate the small vertical movement between the two box portions 82 and 84 when the jacks 64 are actuated to raise or lower the platen 44, an electrically conductive resilient foam gasket 86, preferably composed of silver or carbon-impregnated silicone, is interposed peripherally at their mating juncture at the front of the enclosure and between the lower box portion 84 and the platen 44 so that an EMI, substantially hermetic, and light seal are all maintained despite relative vertical movement between the two box portions 82 and 84. Even though the upper box portion 82 is rigidly attached to the platen 44, a similar gasket (not shown) is preferably interposed between the portion 82 and the top of the platen to maximize sealing.

Figure 6:
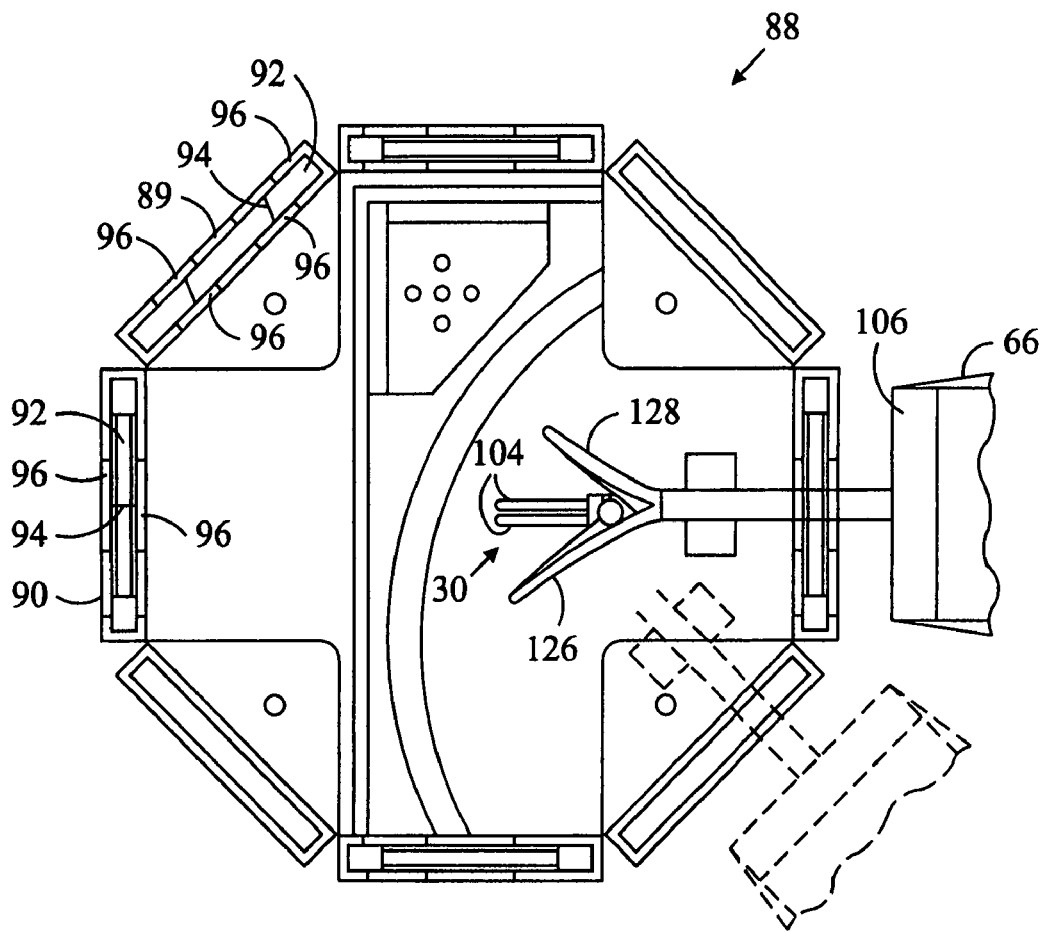
FIG. 6 shows a top sectional view taken along line 6-6 in FIG. 3.

With reference to FIG. 6, the top of the upper box portion 82 comprises an octagonal steel box 88 having eight side panels such as 89 and 90 through which the respective probe positioners 66 can penetrate movably. Atop the octagonal steel box 88 a circular viewing aperture (not shown) is provided having a recessed circular transparent sealing window therein. Each panel comprises a hollow housing in which a respective sheet 92 of resilient foam, which may be similar to the above-identified gasket material, is placed. Slits such as 94 are partially cut vertically in the foam in alignment with slots 96 formed in the inner and outer surfaces of each panel housing, through which a respective probe positioner 66 can pass movably. The slitted foam permits X, Y and Z movement of each probe positioner, while maintaining the EMI, substantially hermetic, and light seal provided by the enclosure.

Referring to FIG. 4, the upper box portion 82 of the environment control enclosure also includes a hinged steel door 98 that pivots outwardly about the pivot axis of a hinge 100. The hinge biases the door downwardly toward the top of the upper box portion 82 so that it forms a tight, overlapping sliding peripheral seal 102 with the top of the upper box portion. When the door is open, and the chuck assembly 14 is moved by the chuck positioner assembly 46 beneath the door opening, the chuck assembly 14 is accessible for loading and unloading.

Figure 5:
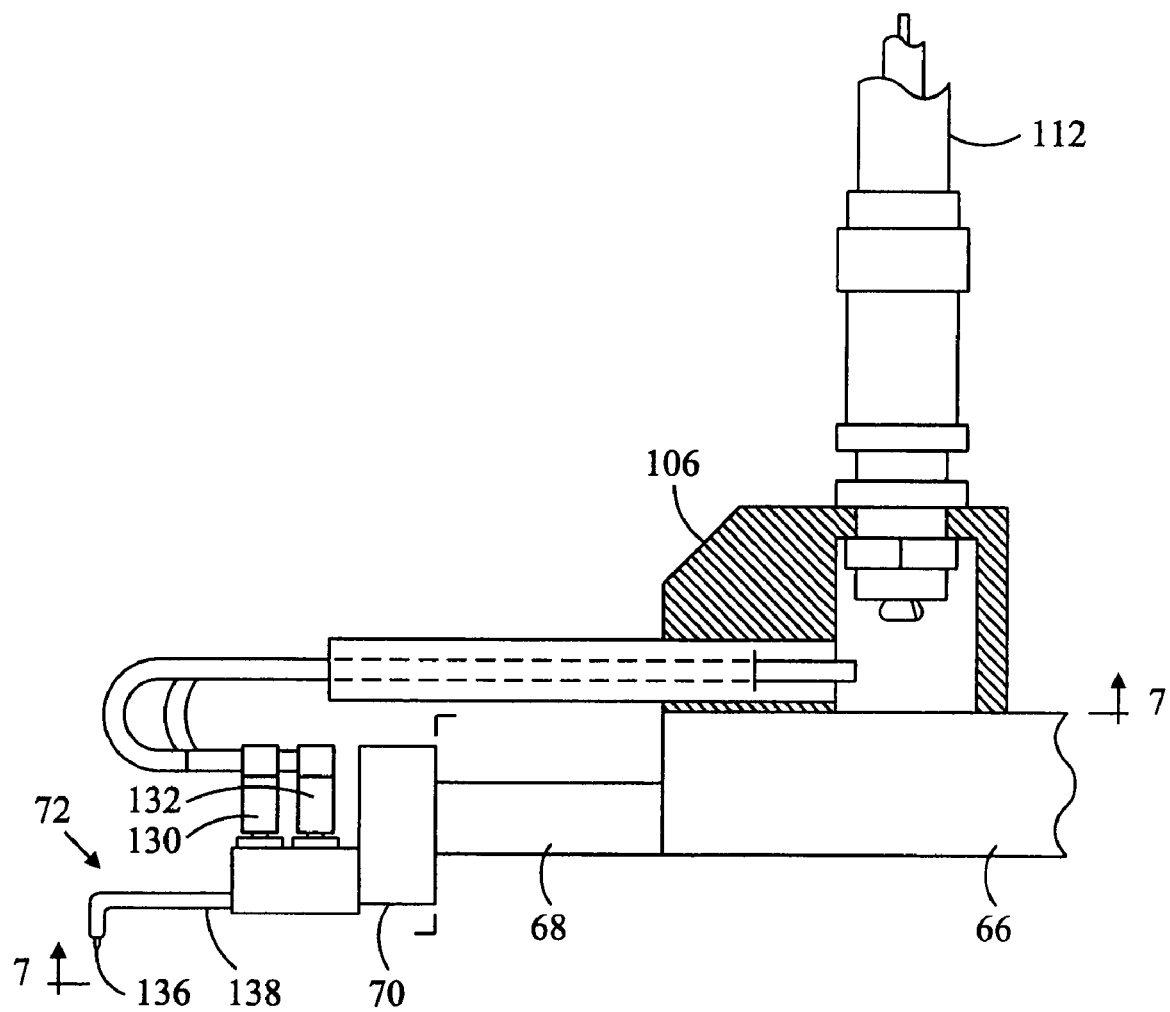
FIG. 5 shows a partially sectional side view of the probe and probe holder shown in the probe assembly in FIG. 1.
Figure 7:
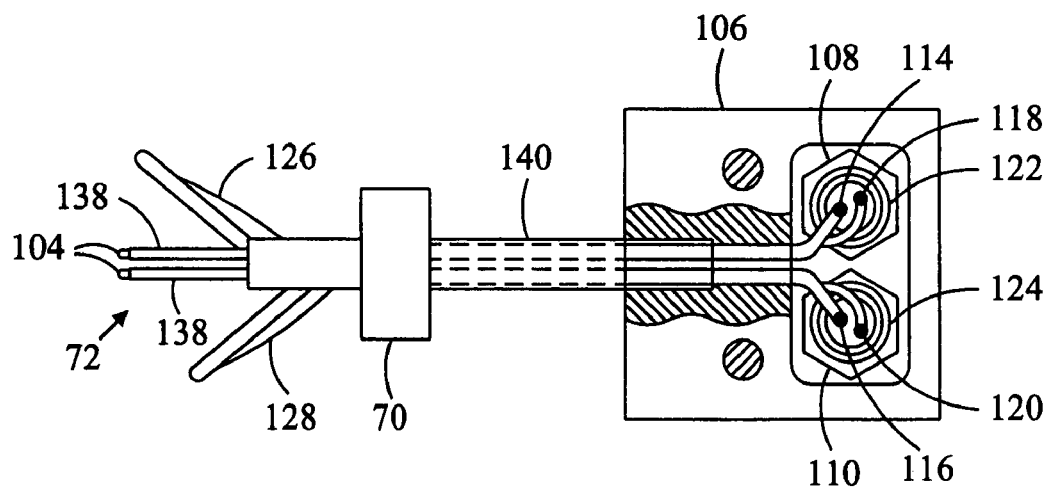
FIG. 7 shows a partially sectional bottom view of the probe assembly taken along line 7-7 in FIG. 5.

With reference to FIGS. 5, 6 and 7, respective individually movable probes 72 comprising pairs of probe elements 104 are supported by respective probe holders 70 which in turn are supported by respective extending members 68 of different probe positioners such as 66. Atop each probe positioner 66 is a shield box 106 having a pair of triaxial connectors 108, 110 mounted thereon with respective triaxial cables 112 entering each triaxial connector from a suitable test instrument as mentioned previously. Each triaxial connector includes a respective inner connector element 114, 116, an intermediate connector element 118, 120, and an outer connector element 122, 124 in concentric arrangement. Each outer connector element 122, 124 terminates by connection with the shield box 106. Conversely, the inner connector elements 114, 116, and the intermediate connector elements 118, 120, are connected, respectively, to the inner and outer conductors of a pair of coaxial cables 126, 128 which therefore are guarded cables. Each cable 126, 128 terminates through a respective coaxial connector 130, 132 with a respective probe element 104 having a center conductor 136 surrounded by a guard 138. In order to provide adequate shielding for the coaxial cables 126, 128, especially in the region outside of the octagonal box 88, an electrically-conductive shield tube 140 is provided around the cables 126, 128 and electrically connected through the shield box 106 with the outer connector element 122, 124 of the respective triaxial connectors 108, 110. The shield tube 140 passes through the same slit in the sheet of foam 92 as does the probe positioner 66. Thus, each individually movable probe has not only its own separate individually movable probe holder but also its own individually movable shield for its guarded coaxial cables, which shield is movable in unison with the probe holder independently of the movement of any other probe holder by any other positioning mechanism. This feature is particularly advantageous because such individually movable probes are normally not equipped for both shielded and guarded connections, which deficiency is solved by the described structure. Accordingly, the probes 72 are capable of being used with the same guarding and Kelvin connection techniques in a ready-to-use manner as is the chuck assembly 14, consistently with full shielding despite the individual positioning capability of each probe 72.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. An assembly comprising:
  (a) a support suitable to support a device-under-test;
  (b) a first member defining a first electrical path to said device-under-test;
  (c) a second member defining a second electrical path to said device-under-test;
  (d) a conductive member vertically spaced apart from at least a portion of said device-under-test; and
  (e) a switch mechanism that alternately electrically connects said second member to a test instrument while electrically isolating said conductive member from said test instrument, and electrically isolates said second member from said test instrument while electrically connects said conductive member to said test instrument.

2. The assembly of claim 1 wherein said conductive member is electrically connected to a guard potential.

3. The assembly of claim 1 wherein at least one of said first member and said second member is a cable.

4. The assembly of claim 1 wherein said first member and said second member form a Kelvin measurement.

5. The assembly of claim 1 wherein said first member and said second member form a quasi-Kelvin measurement.

6. The assembly of claim 4 wherein said second member is a sense connection.

7. The assembly of claim 5 wherein said second member is a sense connection.

8. The assembly of claim 1 wherein said isolating and said electrically connects is substantially simultaneous.

9. The assembly of claim 1 wherein at least a portion of said conductive member at least partially overlaps said support.

10. An assembly comprising:
  (a) a support suitable to support a device-under-test;
  (b) a first member defining a first electrical path to said device-under-test;
  (c) a conductive member vertically spaced apart from at least a portion of said device-under-test; and
  (d) a switch mechanism that alternately electrically connects said first member to a test instrument while electrically isolating said conductive member from said test instrument, and electrically isolates said first member from said test instrument while electrically connects said conductive member to said test instrument.

11. The assembly of claim 10 wherein said conductive member is electrically connected to a guard potential.

12. The assembly of claim 10 wherein said first member is a cable.

13. The assembly of claim 10 wherein said first member is part of a Kelvin measurement.

14. The assembly of claim 10 wherein said first member is a part of a quasi-Kelvin measurement.

15. The assembly of claim 13 wherein said first member is a sense connection.

16. The assembly of claim 14 wherein said first member is a sense connection.

17. The assembly of claim 10 wherein said isolating and said electrically connects is substantially simultaneous.

18. The assembly of claim 10 wherein at least a portion of said conductive member at least partially overlaps said support.

* * * * *